United States Patent
Zhou et al.

(10) Patent No.: US 9,072,180 B2
(45) Date of Patent: Jun. 30, 2015

(54) PRINTED CIRCUIT BOARD CAPABLE OF REDUCING RETURN LOSS OF DIFFERENTIAL SIGNAL AND ELECTRONIC DEVICE USING THE SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Hua-Li Zhou, Shenzhen (CN); Chia-Nan Pai, New Taipei (TW); Shou-Kuo Hsu, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 65 days.

(21) Appl. No.: 14/059,396

(22) Filed: Oct. 21, 2013

(65) Prior Publication Data

US 2014/0167874 A1    Jun. 19, 2014

(30) Foreign Application Priority Data

Dec. 13, 2012  (CN) .......................... 2012 1 0537100

(51) Int. Cl.
*H03H 7/38* (2006.01)
*H05K 1/02* (2006.01)
*H05K 1/16* (2006.01)

(52) U.S. Cl.
CPC ................. *H05K 1/025* (2013.01); *H03H 7/38* (2013.01); *H05K 1/0231* (2013.01); *H05K 1/0245* (2013.01); *H05K 1/162* (2013.01)

(58) Field of Classification Search
CPC ......... H03H 7/38; H03H 7/40; H04B 1/0458; H05K 1/025
USPC .......................................................... 333/32
See application file for complete search history.

(56) References Cited

U.S. PATENT DOCUMENTS

2014/0167875 A1*  6/2014  Shibuya et al. ................. 333/33

\* cited by examiner

*Primary Examiner* — Stephen E Jones
(74) *Attorney, Agent, or Firm* — Novak Druce Connolly Bove + Quigg LLP

(57) ABSTRACT

A printed circuit board (PCB) includes a receiver component, a transmission line including a positive signal transmission line and a negative signal transmission line, a transmitter component, and a capacitance unit. The transmitter component transmits a different signal to the receiver component via the transmission line. The capacitance unit is spaced from the receiver component a predetermined distance S, therein, the predetermined distance S is calculated by a formula $S = V \times (n \ast UI - (C1+C2) \times Zo/2)/2$, and V is a speed of the transmission line. C1 is an equivalent capacitance value of the receiver component, C2 is a capacitance value of the capacitance unit, Zo is a resistance value of the transmission line, UI is a half of one cycle of the differential signal, and n is a value less than or equal to 1.5 and greater than or equal to 0.5.

15 Claims, 4 Drawing Sheets

PRINTED CIRCUIT BOARD CAPABLE OF REDUCING RETURN LOSS OF DIFFERENTIAL SIGNAL AND ELECTRONIC DEVICE USING THE SAME

BACKGROUND

1. Technical Field

The present disclosure relates to printed circuit boards, particularly, to a printed circuit board capable of reducing return loss of differential signals and an electronic device using the printed circuit board.

2. Description of Related Art

Printed circuit boards (PCBs) are necessary parts of an electronic device. The PCB includes a number of electronic components, such as a processor, a memory, a codec. These electronic components communicate with each other using differential signals, and the electronic component reviving the differential signals includes an equivalent capacitor and the equivalent capacitor produces signal reflection and cause a return loss of the differential signals. In the case of a multi-layer PCB, most of electronic components are located on different layers, therefore, transmission lines between the electronic components should pass through a via. In most cases, the via functions as a capacitor, and also produces signal reflection to cause the return loss of the differential signals.

A PCB and an electronic device to overcome the described limitations are thus needed.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will be described with reference to the accompanying drawings. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
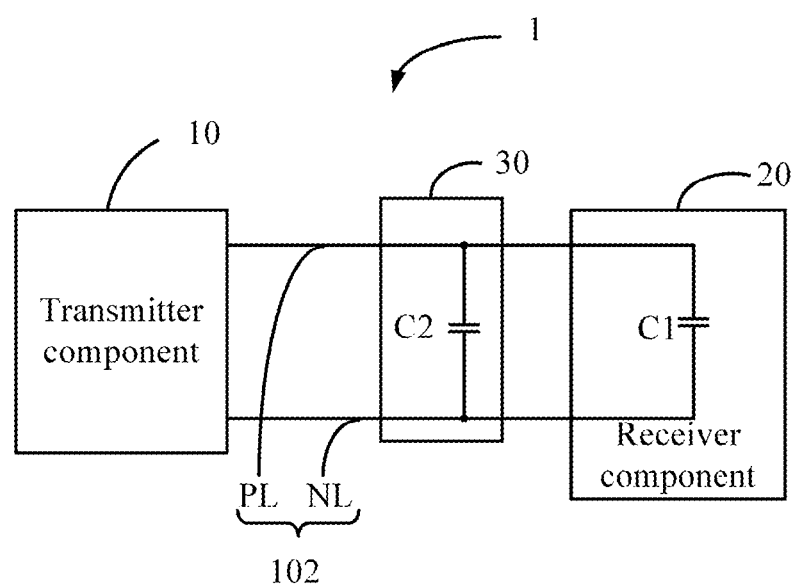
FIG. 1 is an equivalent circuit diagram of a printed circuit board in accordance with a first embodiment.

Referring to FIG. 1, a printed circuit board (PCB) 1 capable of reducing return loss of differential signals is illustrated. The PCB 1 includes at least one transmitter component 10, at least one receiver component 20, at least one transmission line 102, and at least one capacitance unit 30. The transmission line 102 includes a positive signal transmission line PL and a negative signal transmission line NL. Each transmitter component 10 transmits a different signal to a corresponding one receiver component 20 via a corresponding one transmission line 102. The transmitter component 10 and the receiver component 20 can be a processor, a memory, a codec, and the like. The transmitter component 10 and the receiver component 20 can be the same kind or different kind In the embodiment, the number of the transmitter component 10, the receiver component 20, the transmission line 102, and the capacitance unit 30 all are one as example. In other embodiments, the number of the transmitter component 10, the receiver component 20, and the capacitance unit 30 can be more then one.

FIG. 1 shows that the receiver component 20 is equivalent to a capacitor C1. The capacitance unit 30 is located on a position away from the receiver component 20 for a predetermined distance S. In the embodiment, the predetermined distance S is calculated by a formula: $S=V\times(n*UI-(C1+C2)\times Zo/2)/2$. In the formula, "V" is a speed of the transmission line and is a constant value. "C1" is a capacitance value of the capacitor C1, namely an equivalent capacitance value of the receiver component 20. "C2" is a capacitance value of the capacitance unit 30, "Zo" is a resistance value of the transmission line, and "UI" is a half of one cycle of the differential signal, and "n" is a value less than or equal to 1.5 and equal to or greater than 0.5, namely, $0.5 \leq "n" \leq 1$. In an exemplary embodiment, the value of "n" is 1.

The differential signal output by the transmitter component 10 is reflected by both the receiver component 20 and the capacitance unit 30, the receiver component 20 then produces a first reflected signal, and the capacitance unit 30 then produces a second reflected signal. In the embodiment, a phase difference between the first reflected signal and the second reflected signal is 180 degrees. When the receiver component and the capacitance unit are spaced from each other for the predetermined distance, the first reflected signal and the second reflected signal are cancel out. Namely, the predetermined distance S between the capacitance unit 30 and the receiver component 20 is defined as: a 180 degree phase difference between the first reflected signal and the second reflected signal. Thus, the return loss of the differential signal is reduced.

Of course, when the values of the "UI", "C1", "C2", and "Zo" are different, the predetermined distance S is different too. In the embodiment, the values of the "UI", "C1", "C2", and "Zo" can be measured previously, and then the predetermined distance S can be calculated by using the above formula: $S=V\times(n*UI-(C1+C2)\times Zo/2)/2$.

As shown in FIG. 1, the transmission line 102 is printed on one layer of the PCB 1 and does not pass through any via. The capacitance unit 30 includes a capacitor C2, and a capacitance value of the capacitor C2 is the value "C2".

The capacitor C2 is connected between the positive signal transmission line PL and a negative signal transmission line NL and is spaced from the receiver component 20 for the predetermined distance S. As described above, the predetermined distance S can be calculated according to the formula: $S=V\times(n*UI-(C1+C2)\times Zo/2)/2$.

Figure 2:
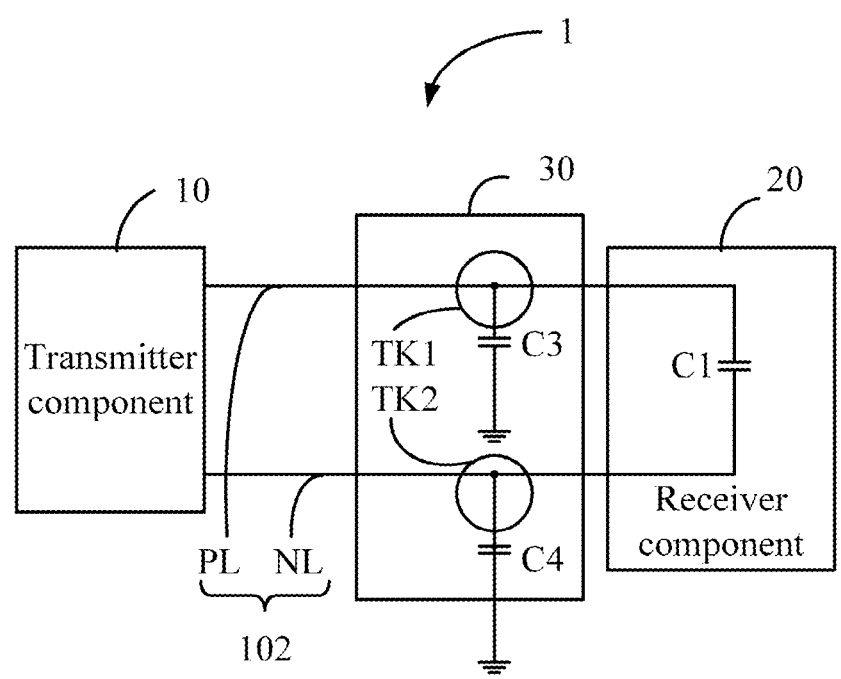
FIG. 2 is an equivalent circuit diagram of a printed circuit board in accordance with a second embodiment.

FIG. 2 shows that in a second embodiment, the transmission line 102 is located on different layers of the PCB 1, the positive signal transmission line PL and the negative signal transmission line NL respectively pass through two vias TK1 and TK2. In the second embodiment, the capacitance unit 30 includes the two vias TK1 and TK2 used for passing through the positive signal transmission line PL and the negative signal transmission line NL. Namely, via TK1 of the capacitance unit 30 is located on a path of the positive signal transmission line PL, and the via TK2 is located on a path of the negative signal transmission line NL.

The two vias TK1 and TK2 are respectively equivalent to a capacitor C3 and a capacitor C4. In detail, as shown in FIG. 2, the via TK1 located on the path of the positive signal transmission line PL is equivalent to the capacitor C3 connected between the positive signal transmission line PL and ground. The via TK2 located on the path of the negative signal transmission line NL is equivalent to the capacitor C4 connected between the negative signal transmission line NL and ground.

The two vias TK1 and TK2 also are spaced from the receiver component 20 for the predetermined distance S, and the predetermined distance S is determined by the formula $S=V\times(n*UI-(C1+C2)\times Zo/2)/2$. In the embodiment, a sum of capacitance values of the capacitor C3 and C4 is equal to the value "C2" of the formula, namely, a sum of the equivalent capacitance values of the first via TK 1 and the second via TK2 is equal to the capacitance value of the capacitance unit 30.

In the second embodiment, the capacitance unit 30 is the two vias TK1 and TK2 spacing from the receiver component 20 for the predetermined distance S. The via TK1 is located on the path of the positive signal transmission line PL is: the positive signal transmission line PL first printed on one layer and connected to a first end of the via TK1, and a second end of the via TK1 is connected to the positive signal line PL printed on another layer. The via TK2 is located on the path of the negative signal transmission line NL is: the negative signal line NL first printed on one layer and connected to a first end of the via TK2, and a second end of the via TK2 is connected to the negative signal line NL printed on another layer.

In the present disclosure, the predetermined distance S is a horizontal distance. In the present disclosure, by adding the capacitance unit 30, the return loss caused by the receiver component 20 can be reduced effectively.

Figure 3:
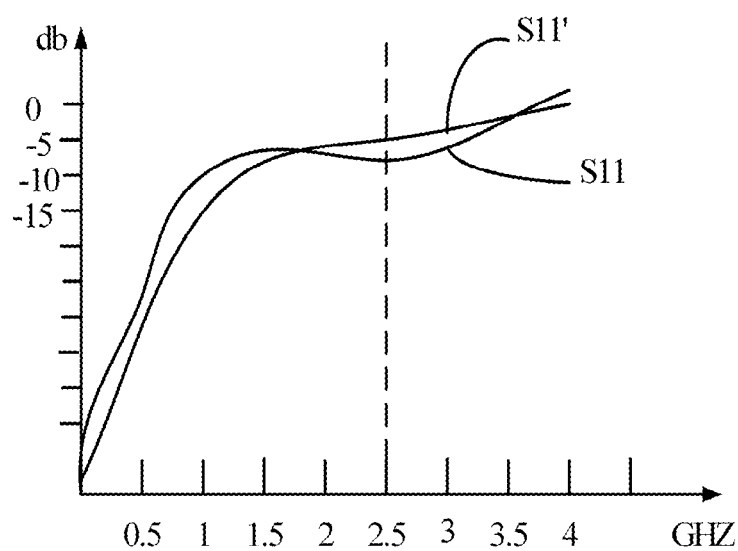
FIG. 3 is a schematic diagram of a return loss of differential signals with a curve formal in accordance with an exemplary embodiment.

FIG. 3 shows that a return loss S11 of the differential signals produced on the PCB 1 with the capacitance unit 30 and a return loss S11' of the differential signals produced on another PCB without the capacitance unit 30 are illustrated. As shown in the FIG. 3, an horizontal axis shows frequency values of the differential signals, and a vertical axis shows values of the return loss corresponding to the frequency values. In the embodiment, the frequency of the differential signal is 2.5 GHZ, as shown in FIG. 3, the return loss S11 is less than the return loss S11' corresponding to the frequency value 2.5 GHZ.

Figure 4:
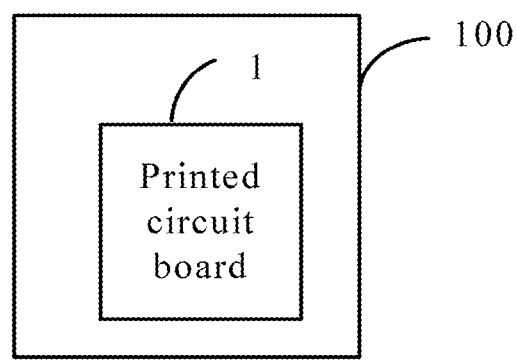
FIG. 4 is a block diagram of an electronic device with a printed circuit board in accordance with an exemplary embodiment.

FIG. 4 shows an electronic device 100. The electronic device 100 includes the PCB 1 as shown in FIG. 1 or FIG. 2. The electronic device 100 also includes other components, such as processors, memory, for example.

In the embodiment, the electronic device 200 can be a tablet computer, a mobile phone, a digital camera, a digital photo frame, and any devices including PCBs.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. A printed circuit board (PCB) capable of reducing return loss of differential signals, the PCB comprising:
    a receiver component;
    a transmission line comprising a positive signal transmission line and a negative signal transmission line;
    a transmitter component configured to transmit a differential signal to the receiver component via the transmission line; and
    a capacitance unit spaced from the receiver component for a predetermined distance S, wherein, the predetermined distance S is calculated by a formula $S=V\times(n*UI-(C1+C2)\times Zo/2)/2$, where V is a speed of the transmission line; C1 is an equivalent capacitance value of the receiver component, C2 is a capacitance value of the capacitance unit, Zo is a resistance value of the transmission line, UI is a half of one cycle of the differential signal, and n is a value less than or equal to 1.5 and equal to or greater than 0.5.

2. The PCB according to claim 1, wherein the differential signal output by the transmitter component is reflected by both the receiver component and the capacitance unit; the receiver component produces a first reflected signal and the capacitance unit then produces a second reflected signal, a phase difference between the first reflected signal and the second reflected signal is 180 degree when the receiver component and the capacitance unit are spaced from each other for the predetermined distance.

3. The PCB according to claim 2, wherein the capacitance unit comprises a first capacitor, the first capacitor is connected between the positive signal transmission line and the negative signal transmission line, and is spaced from the receiver component for the predetermined distance, a capacitance value of the first capacitor is the capacitance value of the capacitance unit.

4. The PCB according to claim 2, wherein the capacitance unit comprises a first via and a second via, the first via is located on a path of the positive signal transmission line, and the second via is located on a path of the negative signal transmission line, the first via is equivalent to a second capacitor connected between the positive signal transmission line and ground, the second via is equivalent to a third capacitor connected between the negative signal transmission line and ground; the first via and the second via are spaced from the receiver component for the predetermined distance and a sum of equivalent capacitance values of the first via and the second via is equal to the capacitance value of the capacitance unit.

5. The PCB according to claim 2, wherein n=1.

6. The PCB according to claim 1, wherein the receiver component is a processor, a memory, or a codec.

7. The PCB according to claim 6, wherein the transmitter component is a processor, a memory, or a codec.

8. An electronic device comprising:
    a printed circuit board (PCB) comprising:
    a receiver component;
    a transmission line comprising a positive signal transmission line and a negative signal transmission line;
    a transmitter component configured to transmit a differential signal to the receiver component via the transmission line; and
    a capacitance unit spaced from the receiver component for a predetermined distance S, wherein, the predetermined distance S is calculated by a formula $S=V\times(n*UI-(C1+C2)\times Zo/2)/2$, where V is a speed of the transmission line; C1 is an equivalent capacitance value of the receiver component, C2 is a capacitance value of the capacitance unit, Zo is a resistance value of the transmission line, UI is a half of one cycle of the differential signal, and n is a value less than 1.5 and greater than 0.5.

9. The electronic device according to claim 8, wherein the differential signal output by the transmitter component is reflected by both the receiver component and the capacitance unit; the receiver component produces a first reflected signal and the capacitance unit then produces a second reflected signal, a phase difference between the first reflected signal and the second reflected signal is 180 degree when the receiver component and the capacitance unit are spaced from each other for the predetermined distance.

10. The electronic device according to claim 9, wherein the capacitance unit comprises a first capacitor, the first capacitor is connected between the positive signal transmission line and the negative signal transmission line, and is spaced from the receiver component for the predetermined distance, a capacitance value of the first capacitor is the capacitance value of the capacitance unit.

11. The electronic device according to claim 9, wherein the capacitance unit comprises a first via and a second via, the first via is located on a path of the positive signal transmission line, and the second via is located on a path of the negative signal transmission line, the first via is equivalent to a second capacitor connected between the positive signal transmission line and ground, the second via is equivalent to a third capacitor connected between the negative signal transmission line and ground; the first via and the second via are spaced from the receiver component for the predetermined distance and a sum of equivalent capacitance values of the first via and the second via is equal to the capacitance value of the capacitance unit.

12. The electronic device according to claim 9, wherein n=1.

13. The electronic device according to claim 8, wherein the receiver component is a processor, a memory, or a codec.

14. The electronic device according to claim 13, wherein the transmitter component is a processor, a memory, or a codec.

15. The electronic device according to claim 8, wherein the electronic device is a table computer, a mobile phone, a digital camera, a digital photo frame.

* * * * *